United States Patent
Worley

(10) Patent No.: US 7,989,822 B2
(45) Date of Patent: Aug. 2, 2011

(54) OPTOCOUPLER USING SILICON BASED LEDS

(75) Inventor: Eugene Robert Worley, Irvine, CA (US)

(73) Assignee: Eugene R. Worley, Irvine, CA (US)

( * ) Notice: Subject to any disclaimer, the term of this patent is extended or adjusted under 35 U.S.C. 154(b) by 306 days.

(21) Appl. No.: 12/291,486

(22) Filed: Nov. 10, 2008

(65) Prior Publication Data

US 2009/0121236 A1    May 14, 2009

Related U.S. Application Data

(60) Provisional application No. 61/002,179, filed on Nov. 8, 2007.

(51) Int. Cl.
*H01L 33/00* (2010.01)

(52) U.S. Cl. ............ 257/88; 257/83; 257/84; 257/93; 257/E33.044; 438/22; 438/24

(58) Field of Classification Search .......... 257/78–98, 257/435–438; 438/22–24
See application file for complete search history.

(56) References Cited

U.S. PATENT DOCUMENTS

| | | | |
|---|---|---|---|
| 5,438,210 A | 8/1995 | Worley | |
| 6,103,564 A * | 8/2000 | Masuda | ............ 438/237 |
| 6,365,951 B1 | 4/2002 | Worley | |
| 6,376,851 B1 | 4/2002 | Worley | |
| 6,393,183 B1 | 5/2002 | Worley | |
| 6,710,376 B2 | 3/2004 | Worley | |
| 6,757,381 B1 | 6/2004 | Worley | |
| 6,864,509 B2 | 3/2005 | Worley | |
| 6,864,555 B2 | 3/2005 | Worley | |
| 6,885,016 B2 | 4/2005 | Worley | |
| 2003/0042405 A1 * | 3/2003 | Worley | ............ 250/214.1 |

OTHER PUBLICATIONS

T. Hoang, P. LeMinh, J. Holleman, J. Schmitz, "Strong Efficiency Improvement of SOI-LEDs Through Carrier Confinement," IEEE Electron Device Letters, vol. 28, No. 5, pp. 383-38.

G. Pan, R. Ostroumov, Y. Lian, K. Tu and K. Wang, "(1 13) Defect-Engineered Silicon Light-Emitting Diodes," International Electron Devices Meeting, pp. 343-346, 2004.

N. Soboleva, et. al, "Extended structural defects and their influence on the electroluminescence in efficient Si light-emitting diodes," Physica B 340-342, pp. 1031-1035, 2003.

* cited by examiner

*Primary Examiner* — Dung A. Le

(57) ABSTRACT

This invention details how a low cost opto coupler can be made on Silicon On Insulator (SOI) using conventional integrated circuit processing methods. Specifically, metal and deposited insulating materials are use to realize a top reflector for directing light generated by a silicon PN junction diode to a silicon PN junction photo diode detector. The light generator or LED can be operated either in the avalanche mode or in the forward mode. Also, side reflectors are described as a means to contain the light to the LED-photo detector pair. Furthermore, a serpentine junction PN silicon LED is described for the avalanche mode of the silicon LED. For the forward mode, two LED structures are described in which hole and electrons combine in lightly doped regions away from heavily doped regions thereby increasing the LED conversion efficiency.

16 Claims, 8 Drawing Sheets

OPTOCOUPLER USING SILICON BASED LEDS

RELATED APPLICATION

This application claims the benefit of U.S. Provisional Application No. 61/002,179 entitled "An Optocoupler using Silicon Based LEDs," filed on Nov. 8, 2008, the specification of which is incorporated herein in its entirety by reference.

FIELD OF THE INVENTION

The present invention relates generally to optocoupler, and to particularly to silicon-based optocouplers.

BACKGROUND

Optocouplers provide a means of isolating two electrical circuits that need to communicate signals with each other but can't be electrically tied to one another. One reason for the electrical isolation is that electrical noise generated in one circuit, for example an electric motor switching circuit, may upset operations in another circuit, for example a microcontroller that controls the motor. Another reason is to eliminate an electrical hazard for humans by electrically isolating a dangerous high voltage circuit.

Optocouplers are able to send signals from one circuit to a second circuit using light instead of wires by incorporating a Light Emitting Diode (LED) to generate a light signal from an electrical signal and a light detector to receive the light signal and convert it back into an electrical signal. The typical LED uses a GaAsP based material and the typical photo detector uses a silicon based PN junction diode. These two dissimilar materials, GaAsP and silicon, require a hybrid package construction. Also, it is not practical to make transistors in the GaAsP material. Thus, optocouplers today are largely confined to providing just the basic signal isolation function and do not include surrounding system circuitry.

The most desirable implementation of an optocoupler from a cost and circuit density point of view is to have the optocoupler function imbedded into a silicon system chip. In fact, in power systems the trend has been to imbed digital logic into power chips to make what is termed Power Management Integrated Circuits (PMCs). However, the optocoupler function remains external to PMICs. The limiting factor has been that silicon based LEDs have poor light emission efficiency. However, there is enough light emission efficiency from a silicon PN junction to make practical, all silicon optocouplers if a high gain amplifier is connected to the output of the photo detector. With silicon on insulator (SOI), isolation of the LED and photo detector is achieved using transparent insulating materials. Furthermore, different system circuits can be made in the same SOI material as the optocoupler.

There are at least two ways in which a silicon PN junction can emit light. In an avalanche or reverse breakdown mode, silicon emits visible light that is yellow in color to the naked eye. In a forward mode, silicon emits infra (IR) light. U.S. Pat. No. 6,365,951 discloses methods for making silicon based LEDs. Recent reports in literature show that when properly constructed, the light efficiency of a silicon PN junction operated in the forward mode is much more efficient than previously thought. Furthermore, silicon PN junction diodes can detect both the visible light emitted the reverse breakdown mode and the IR light emitted in the forward mode. However, the silicon PN junction is not as efficient at detecting IR light as it is for visible light.

In U.S. Pat. No. 5,438,210 an all silicon opto-coupler was proposed using silicon on insulator (SOI) material. The present disclosure builds on the concepts of this patent and provides more detail on constructing an SOI based, all silicon optocoupler that can be made using standard IC processing methods.

SUMMARY

It is the objective of this invention to show construction details of a low cost, monolithic, all silicon optocoupler using SOI. Construction details include layouts for the silicon LED for both the reverse and the forward light emitting modes, the silicon PN junction detector, and the light-coupling medium. The construction methods are compatible with existing SOI integrated circuit processing and the optocoupler can be placed into a standard integrated circuit package. Also, LED structures are described providing increased electrical to light conversion efficiency by having free holes and electrons recombine directly in lightly doped or intrinsic regions of silicon rather than recombining in heavy doped silicon which results in poor light emission. These LED structures can be made in either SOI silicon or bulk silicon.

DESCRIPTION OF THE PREFERRED EMBODIMENT

Figure 1:
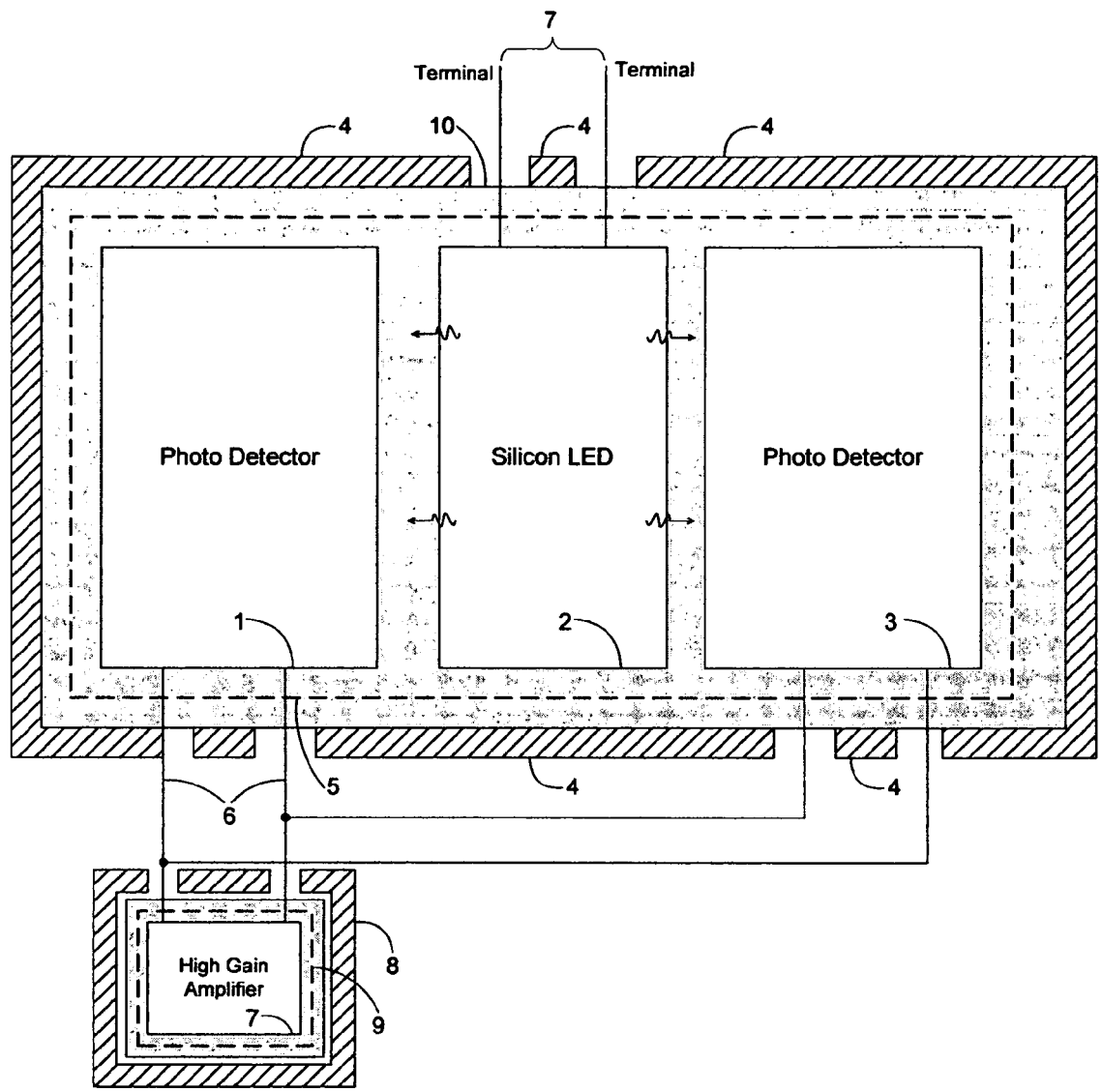
FIG. 1. shows a top view block diagram of the basic elements of an SOI optocoupler of the preferred embodiment including the silicon LED, photo detectors, and photo current amplifier.

FIG. 1. shows a top view block diagram of the basic elements of an SOI optocoupler of the preferred embodiment. These elements include a silicon LED 2, photo detectors 1 and 3 which surround the LED 2, a light reflector 5 placed over the LED photo detector combination, and perimeter light reflector 4. Deposed between the LED 2 and photo detectors 1 and 3 is a transparent electrical insulating material 10. Electrical access to the photo detector is made by terminals 6 and electrical access to the LED is made by terminals 7. LED 2 can be made to emit either visible light or Infra Red (IR) light. Photo detectors 2 and 3 can be made of silicon or, for better IR detection, deposited Silicon Germanium (SiGe).

Also, the photo detectors can be Schottky barrier diodes made with silicon, which also have better IR detection.

The silicon LED 2 generally emits light in all directions. That is, to the left, right, top, and bottom. The objective is to steer the light to the photo detectors and to prevent the light from escaping from the optocoupler. Light emitted from LED 2 that fails to be absorbed by the photo detectors 1 and 3 will reduce the performance of the optocoupler. The reduced performance includes reduced signal to noise ratio and reduced data bandwidth or data transfer speed between the LED 2 and the photo detectors 1 and 3.

Since the coupling efficiency is expected to be low due to the low electrical to light conversion efficiency of the LED 2 a high gain, low noise amplifier 7 is required. The coupling quantum efficiency is roughly one electron output from the photo detectors 1 and 3 for every million electrons input to the LED 2. Thus, an LED current of 1 mA will result in a photo-current of 1 nA. Since the amplifier elements are light sensitive a light reflector 9 is placed over the amplifier and perimeter light reflector 8 is placed around the amplifier. This light reflector 9 is of the same type of material as that of the optocoupler light reflector 5. Also, the perimeter light reflector 8 is of the same type or material and construction as the perimeter reflector 4. In the case of the amplifier 7 light is coming in from outside the amplifier 7 as opposed to the optocoupler were light is coming from inside the coupler. The light reflector 9 and the perimeter reflector 8 therefore will reflect stray light that manages to escape the optocoupler light confinement.

Figure 2A:
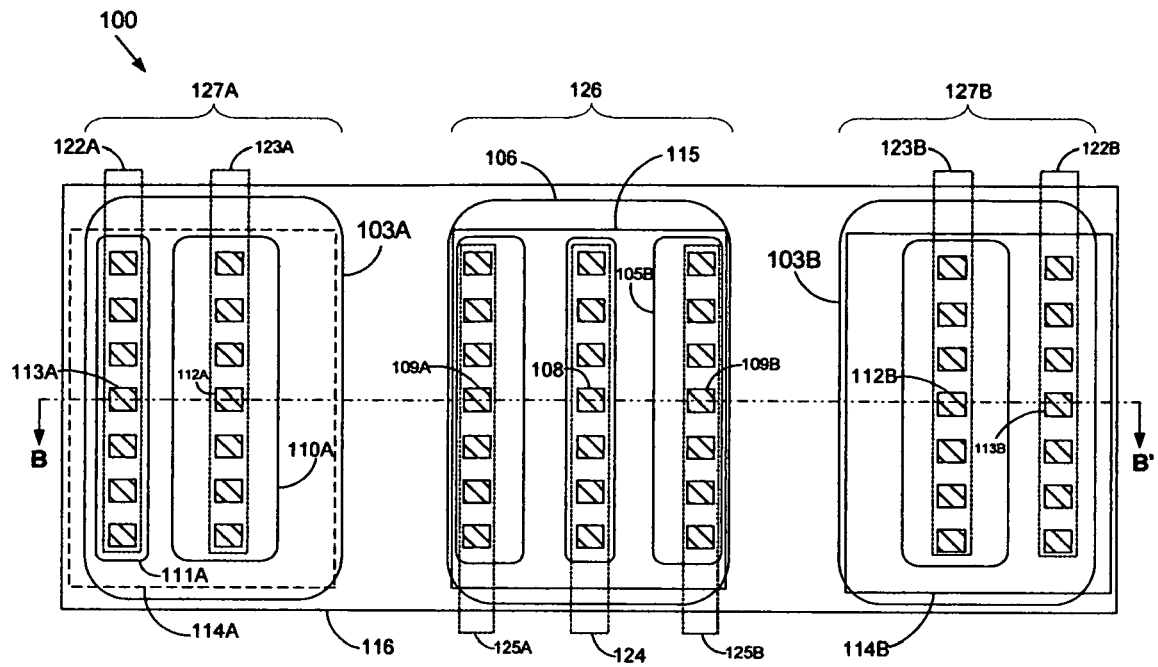
FIG. 2A shows a top and FIG. 2B shows a side view of the preferred embodiment of an SOI optocoupler.
Figure 2B:
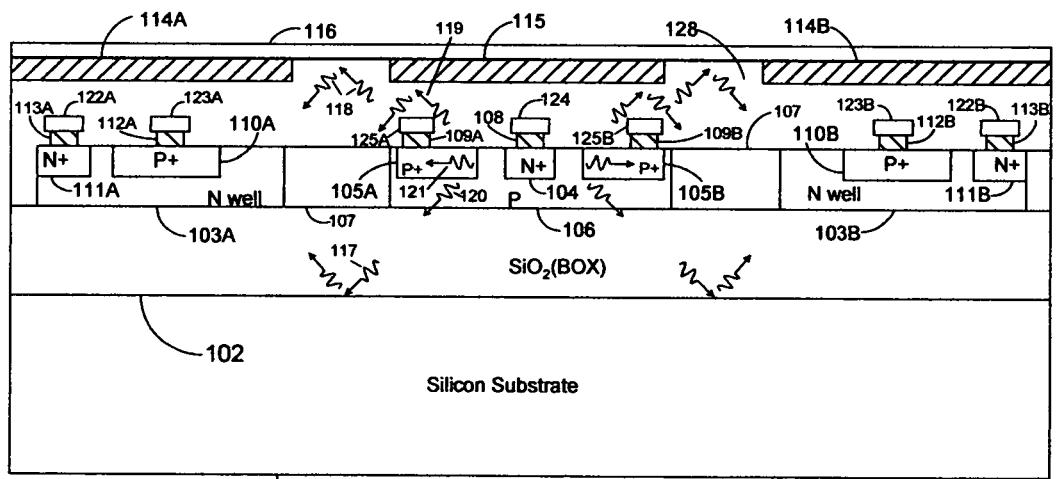

FIG. 2A shows a top view and FIG. 2B a cross section of the preferred embodiment of an all silicon SOI optocoupler. SOI is formed by taking a silicon substrate wafer 101 and growing or depositing an oxide 102 on top of the substrate 101. This oxide layer is referred to a Buried Oxide or BOX. Although the typical thickness for the BOX layer is 1 µm a more appropriate thickness for optocoupler isolation is 2 to 3 µm. Also, sapphire can be substituted for the silicon substrate 101. A second silicon region is then either deposited on top of the BOX layer or a second silicon wafer is bonded onto the top of the BOX layer. For one SOI material process, the BOX layer is formed using oxygen implanted into silicon call SiMOX. It is the top silicon layer that is used to make circuits including silicon devices such as diodes and transistors.

FIG. 2A shows three silicon island areas 103A, 103B, and 106; two for the detectors 127A and 127B, and one for the LED 126. In between the silicon islands 103A, 103B and 106 are so called isolation trenches 107. Isolation trenches 107 are filled with an insulator such as oxide. If the trenches are deep, they can also be filled with polysilicon. However, polysilicon is semi conducting, even if left undoped. Thus, for electrical isolation between the LED and photo detectors, oxide is the preferred trench filler material. Also, it is preferred that the trench material be transparent to allow light to pass through it from the LED 126 to the photo detectors 127A and 127B. Above the silicon islands an oxide or suitable transparent insulator 128 is deposited or grown from the silicon islands 103A, 103B, and 106.

The LED 126 is shown as a PN junction diode with a silicon island 106 doped P type. Two diffusions or implants are made into the silicon island 106, an N+ 104 diffusion and two P+ diffusions, 105A and 105B. To make connections to the LED diffusions contact plugs are employed including 109A and 109B for the P+ diffusions and 108 for the N+ diffusion. The plugs 105A, 105B and 108 then make contact to metal interconnect lines 125A, 125B, and 124, respectively. Metal interconnect lines 125A and 125B are the anode terminal connections for the LED 126 and 124 is the terminal connection for the cathode of the LED 126. The PN junction is formed between the P type island 106 and the N+ diffusion 104. Note in FIG. 2A that the metal lines, 122A, 123A, 125A, 124, 125B, 123B and 122B are drawn transparent to the under lying contacts such as 113A, 112A, 109A, 108, 109B, 112B, and 1133B. This is done to allow the contacts under the metal lines to be viewed. The aforementioned metal lines are also drawn transparent to the diffusions including 111A, 110A, 105A, 105B, 104, 110B, and 111B and to the silicon islands 103A, 106, and 103B.

The PN junction LED diode 126 can be operated either in the forward mode or the reverse mode. In the forward mode light is emitted in the infrared region (about 1.1 µm wavelength) whereas is the reverse or avalanche mode visible light is emitted with a typical yellow color having a wavelength of about 0.6 µm. For the reverse mode, to keep the breakdown voltage low, the P island 106 is doped somewhat heavy, in the area of 1e18/cm$^3$. For the forward mode, the P island is doped very lightly (<1e15/cm$^3$). In fact, the P type doping of island 106 should be done at the time of silicon formation since implanting silicon will lower the light emission efficiency in the forward direction due to implant damage that is not fully annealed out. The infrared light of the forward mode cannot be detected by a PN junction diode as efficiently as the visible light of the reverse mode but the forward mode has a higher quantum efficiency than the avalanche mode.

The photo detector of FIG. 2B is realized as a PN junction diode built in N type islands 103A and 103B. Two diffusion or implant types are present in each photo detector silicon island, P+ 110A and 110B, and N+ 111A and 111B. The junction is formed between the P+ diffusions 110A and 110B and the N type islands 103A and 103B. To connect to the junctions of the diode, contact plugs 112A and 112B are used to connect to the P+ diffusions 110A and 110B, respectively, and contact plugs 113A and 113B are used to connect to the N+ diffusions 111A and 111B, respectively. The aforementioned contact plugs make contact to the metal interconnect with metal line 123A making contact to contact plug 112A and metal line 123B making contact to contact plug 112B. These two metal lines are the anode terminal connections for the two photo conducting diodes 127A and 127B. Metal line 122A makes contact to contact plug 113A and metal line 122B makes contact to contact plug 113B. The metal lines 122A and 122B are the cathode terminal connections of the two photo conduction diodes 127A and 127B.

It is the overall objective to have light emitted by the silicon based LED 126 to be absorbed by the silicon of the photo detectors 127A and 127B. The materials that influence the propagation of the light between the LED 126 and the photo detectors 127A and 127B include transparent insulating material such as oxide, reflecting surfaces such as metal, semi-reflecting interfaces such as oxide-silicon interfaces, and the silicon of the LED 126. Silicon is semi-transparent absorbing some light as it transmits the light through it. It is the absorbed component of light in the silicon of the photo-detectors 127A and 127B that creates the photo current.

Light is emitted in the PN junction area of the LED 126. The PN junction, as noted earlier, is the P doped island 106 and the N+ diffusion 104. For the avalanche mode, the light is emitted in the depletion region near the junction where the electric field is high. For the forward mode of LED 126, light emission is in the P region 106 between the P+ diffusions 105A and 105B and the N+ diffusion 104. Light can be emitted in a number of directions as shown in FIG. 2B. While some light generated in the LED 126 will be absorbed by the silicon of the LED 126 itself much of it will escape from the silicon. Light can emitted upward 119 toward the top of the LED 126, to the side 121, and toward the bottom 120. It is desired to have these light components reach the photo detectors 127A and 127B as much as possible. Light photons are converted to charge carriers predominately in the N doped silicon island areas 103A and 103B of the photo detectors 127A and 127B. For the light emitted toward the bottom 120, the silicon-silicon dioxide ($SiO_2$) interface can reflect some light and transmit the rest depending on the angle of incidence. The reflective properties of an interface depend on the ratio of the index of refraction of the two different mediums. For the downward right light component 120 some light 117 will reflect off of the island 106-oxide 102 interface while a light component will transmit through the interface toward the silicon substrate 101-oxide interface. Some of the light striking the silicon substrate 101-oxide 102 interface will be transmitted into the silicon substrate and lost. The horizontal component of light 121 that makes it through the LED silicon without being absorbed will enter the oxide 128 essentially un-reflected due to the 90 degree incidence angle and enter the N region 103A of the photo detector 127A. The upward right light component 119 will propagate through the oxide or inter level dielectric 128 and reflect off of a metal reflector 115 toward the photo detector 127A. Light reflecting metal 114A and 114B is also placed above the photo detector. A gap exists between the metal reflector 115 above the LED 126 and the two metal reflectors 114A and 114B above the photo detectors 127A and 127B, respectively. Having this gap as opposed to a continuous piece of metal improves dielectric isolation and greatly reduces capacitive coupling between the LED and the photo detectors. Also, the separate metal reflectors can be tied to a respective ground shielding potential. For example, the photo detector metal reflectors 114A and 114B can be tied to the photo detector's ground potential and the LED metal reflector 115 to the LED's ground potential. However, if the transparent dielectric 128 is thick enough and has a sufficiently high dielectric breakdown, then a continuous overhead metal reflector with no gaps between the LED's reflector 115 and the reflectors 114A and 114B of the photo detector diodes 127A and 127B can be used. For the case of a continuous metal reflector it can be left floating providing there is no means to charge it such as during manufacturing when exposed to a plasma etch. For this case a wet etch can be used which doesn't charge the metal.

A reflecting or semi-reflecting, electrically insulating material 116 is placed over the metal reflectors 114A, 115, and 114B as shown in FIG. 2B. This is done to reflect light from the LED 126 that strikes in the gap areas between the reflector 115 and the reflectors 114A and 114B. The common types of semiconductor materials that are insulating and have an index of refraction different from the inter level dielectric 128 include silicon nitride, photo resist, and polyamide. For example, if the inter level dielectric 128 is oxide ($SiO_2$) and reflective insulating layer 116 is silicon nitride then there will be a light reflecting property depending on the angle on incidence of the light on the interface. Also, the insulating reflecting layer 116 can be optionally placed under the metal reflectors 115, 114A and 114B instead of above them as shown in FIG. 2B.

As can be appreciated by one normally skilled in the art, the impurity or doping polarities of the silicon islands shown in FIGS. 2A and 2B can be inverted separately for the LED 126 and separately for the photo detectors 127A and 127B. For example, for the LED 126 the P+ diffusion or implant 104 can be N+ type, the island 106 can be N type, and the N+ diffusions or implants 105A and 105B P type.

For older processes, the contact plugs such as 108 shown in FIG. 2B are actually the metal layer 124 dipping down a contact hole instead of a separate plug of metal as is found in later processes.

Figure 3A:
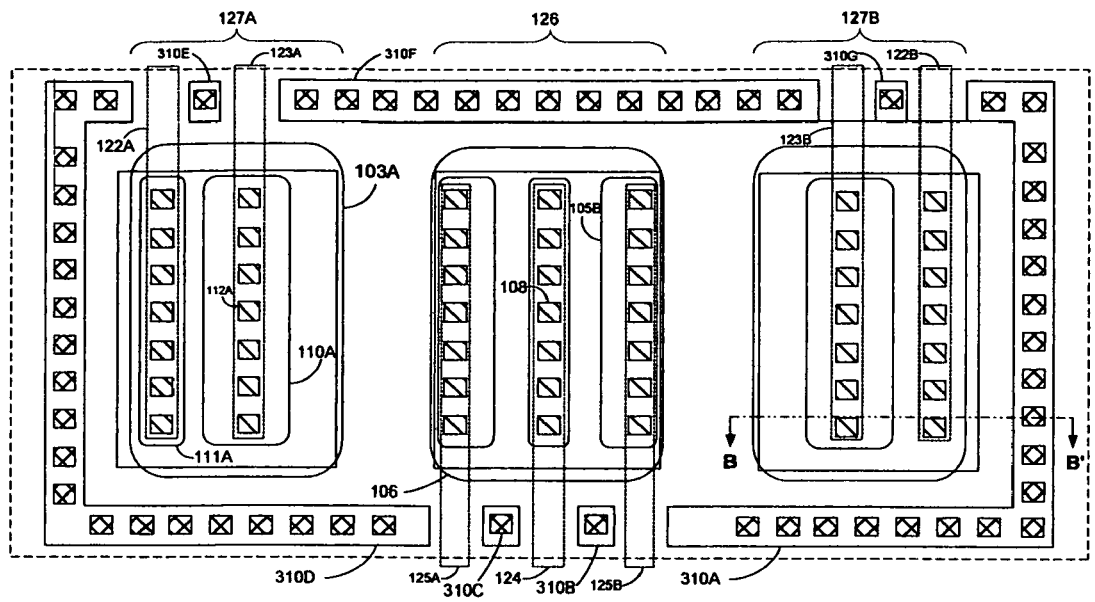
FIG. 3A shows a top view and FIG. 3B shows a side view of a perimeter reflector ring.
Figure 3B:
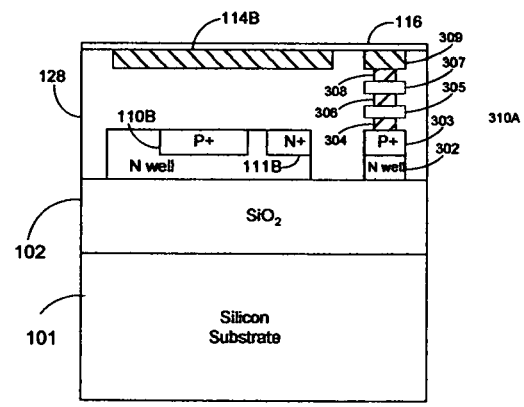

FIG. 3A shows a top view of a perimeter reflector ring placed around the optocoupler of FIGS. 2A and 2B and FIG. 3B shows a cross section through the right side reflector ring and includes a cross section of the right photo detector 127B. The perimeter reflector ring includes sections 310A, 310B, 310C, 310D, 310E, 310F, and 310G and is broken due to the LED leads 125A, 124, and 125B and photo diode leads 123A, 122A, 123B and 122B. The intent of the perimeter reflector ring is to reflect light back into the optocoupler that would otherwise escape from the perimeter of the optocoupler. For illustration purposes, three metal layers are assumed. The two lower layers of metal are used for interconnect within the optocoupler and the top layer for as a reflector as noted earlier. Referring to the cross section FIG. 3B, the end island 302 is shown as being N doped but could also be P doped. A diffusion or implant region 303 is shown as being P+ but could also be N+. Placed on top of the P+ diffusion is a contact plug 304, which is metallic and has reflective properties. On top of the contact plug 304 is the first metal layer 305, which also has reflective properties. On top of the first metal layer 305 is a second contact plug 306 and on top of second contact plug a second metal layer 307. For cases in which the top metal 309 is contacted a third plug 308 is placed on top of metal layer 307. If the top layer of metal, which is used as a reflector such as 114B, is not contacted then there is no plug 308 between metal layer 307 and metal layer 309, which is of the same layer as 114B. As can be appreciated by one normally skilled in the art, additional metal layers and contact plugs be arranged in a similar manner as a continuation of the stack 310A if the process has more metal layers than that shown on FIG. 3B. The stack 310 can, because of the reflective properties of the contacts and metal layers, reflect light that would otherwise exit from the perimeter of the optocoupler area and not contribute to the generation of photo current in the photo diodes 127A and 127B.

Figure 4:
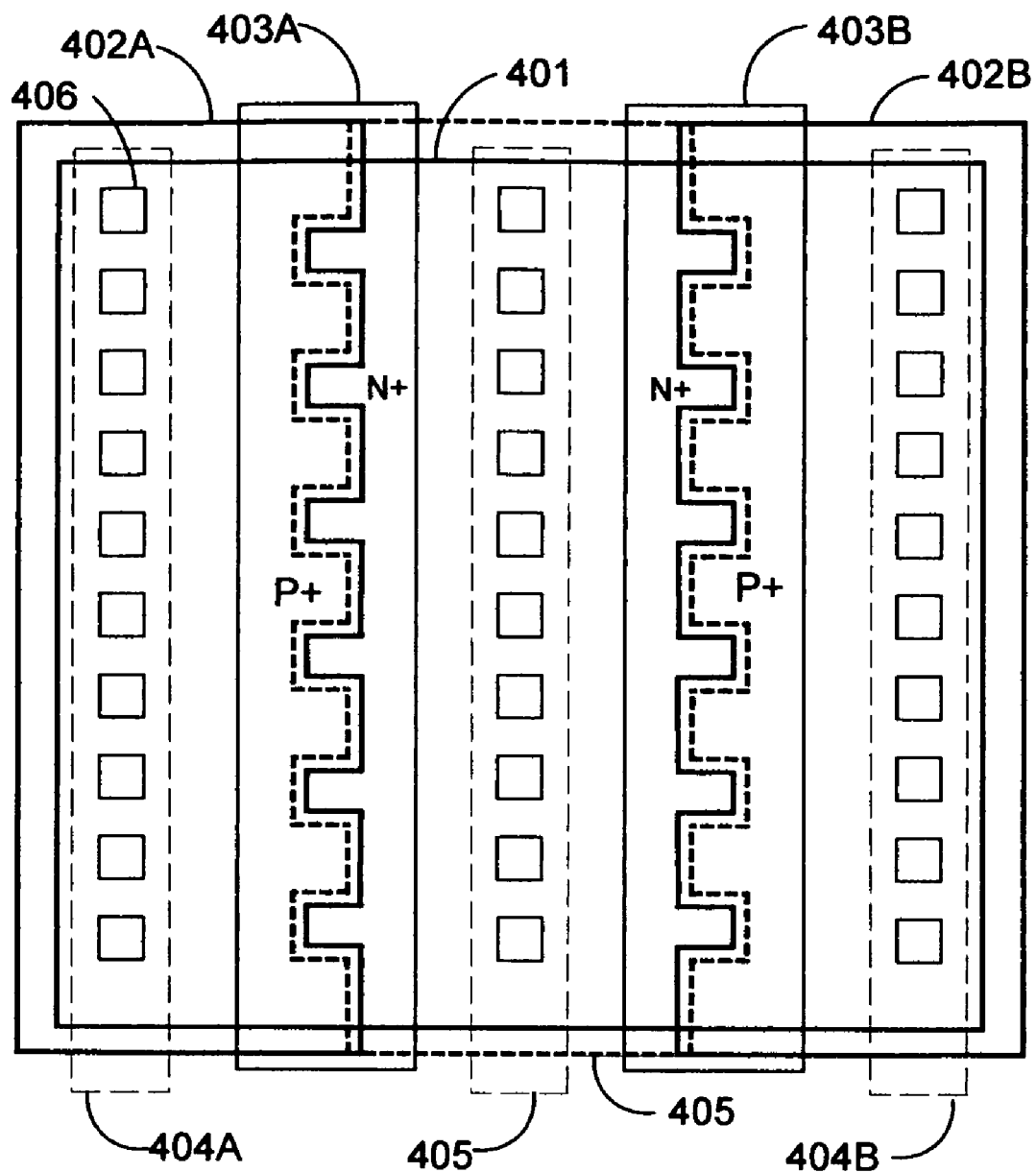
FIG. 4 shows a top view of the preferred embodiment of a N+P+ LED.

FIG. 4 shows a top view of the preferred layout of an avalanche PN junction LED that is made using the N+ and P+ implants of a standard SOI CMOS process. The N+ implant is used in the drain and source of NFETs and the P+ implant is used in the drain and source of PFETs. The advantage of an N+P+junction diode is the low breakdown voltage, about 4V.

401 is the silicon island of the LED, 406 is an example of a contact which is used to connect the doped silicon areas to metal interconnect, metal lines 404A and 404B are the anode terminals of the diode, and metal line 405 is the cathode terminal of the diode. The N+ region is defined by an N+ mask 405 and the P+ regions by the P+ masks 402A and 402B. Note the N+ and P+ masks overlap slightly to guarantee that there is no gap between the N+ and P+ junction caused by mask misalignment and photo lithography tolerances. The overlap region is either N type or P type depending on which implant produces the highest impurity concentration. Typically, the N+ implant produces the higher impurity concentration over the P+ implant. Note that the P+N+ junction boundary is made with a notched or serpentine pattern. This pattern increases the lateral PN junction area making the diode more efficient with respect to layout area. Also note that salicide block masks 403A and 403B have been placed over the P+N+ junction area to prevent salicide from shorting the junctions. Some processes do not have salicide and, therefore, do not require a salicide block mask.

Papers have shown that the greatest infrared light emission is achieved in silicon if holes and electrons come together and recombine in lightly doped silicon, and in particular, if the background doping is not introduced through implantation but through other means such as diffusion. Light emission efficiency is reduced if the holes and electrons recombine in heavily doped silicon. Thus, it is highly desirable to have high concentrations of holes and electrons come together in lightly doped silicon so that light producing recombination takes place. The problem is how to create the above situation.

Figure 5A:
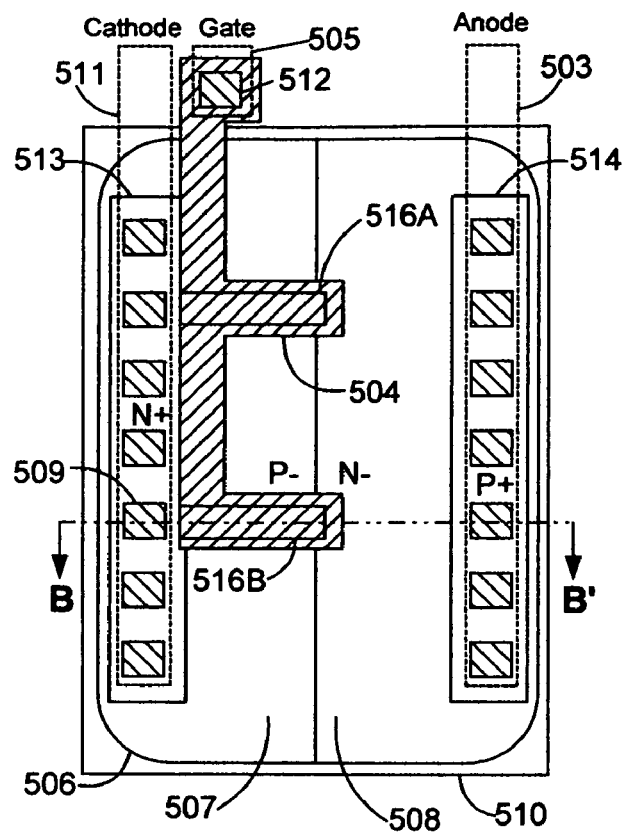
FIG. 5A shows a top view and FIG. 5B shows a side view of the preferred embodiment of an Infrared silicon light emitter using an SCR construction with a MOSFET gate to lower the triggering voltage.
Figure 5B:
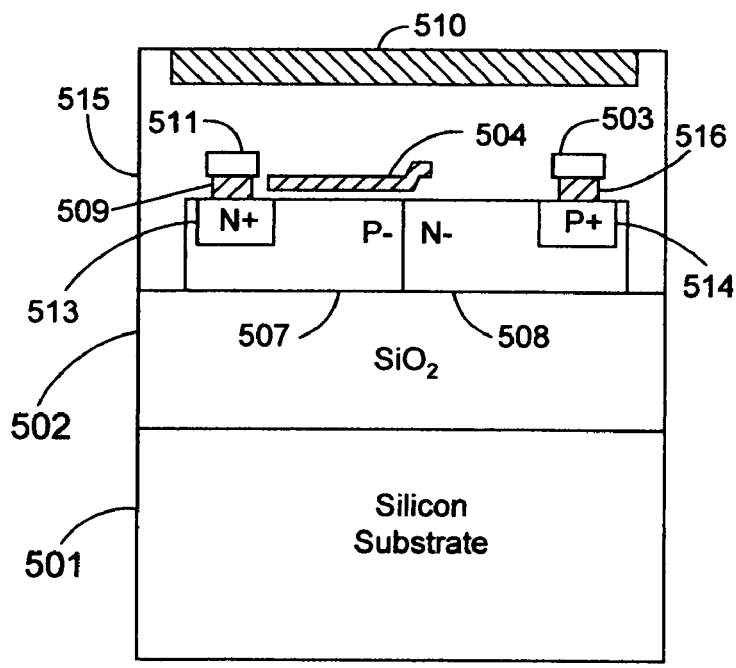

A way to accomplish this feat is to create a PNPN diode or Silicon Controlled Rectifier. FIG. 5A shows a top view and FIG. 5B a side view of a PNPN diode. PNPN diodes have two states, an "off" state and a conducting state. The PNPN diode is shown here constructed on SOI material with 501 being the silicon support substrate and 502 being the insulator or BOX layer 502. On the BOX layer 502 is a thin layer of silicon, which is etched to form an island comprising a lightly doped N region 508 and a lightly doped P region 507. The doping for these regions would be anywhere from $10^{14}$ to $10^{16}$ impurity atoms per cubic centimeter. One of the two regions can be the background doping of the silicon island. This doping is done at the time of the growth of the silicon wafer. The second lightly doped region can be made from either a weak implant dose or a diffusion which counter dopes the first impurity. The metal anode terminal 503 connects to a P+ diffusion or implant 514 using contacts such as 516. The metal cathode terminal 511 connects to an N+ diffusion or implant 513 using contacts such as 509. Also shown is a metal reflector 510 above the PNPN diode with a transparent insulator such as SiO$_2$ 515 filling the region around the diode and supporting the metal reflector 510. Thus, the PNPN structure consists of P+ region 514 that connects to a terminal 503 followed by an N− region 508, followed by a P− region 507, and followed by an N+ region 513 that connected to a terminal 511.

The objective is to place the PNPN diode into a conducting state. Once conducting, holes from the P+ region will be injected into the N− 508 and P− 507 regions. Correspondingly, electrons from the N+ region 513 will be injected into the P− 507 and N− 508 regions. Thus, high concentrations of holes and electrons will be present in the P− 507 and N− 508 regions where light producing recombination takes place. The problem is that the voltage needed to trigger the PNPN diode into the conducting state can be greater than 100V if avalanche breakdown is used to initiate conduction. What blocks conduction when the PNPN diode is in the off state is the N−P− junction, which can have a very high avalanche breakdown voltage due to the light doping. To trigger the PNPN diode at low voltages a MOSFET gate 504 is introduced. The gate is typically made of polysilicon with a thin oxide 516A and 516B under it so that with the application of a voltage with respect to the cathode 511 an inversion layer of electrons is formed under the gate 508 in the thin oxide areas 516A and 516B. This forms a conducting path of electrons from the N− region 508 to the N+ region 513 of the cathode. This path forward biases the P+ 514 N− 508 junction causing holes to be injected into the N− region 508. This process triggers the PNPN diode into the conducting state. The gate 504 is connected to a metal terminal 505 using a contact 512. Note that the gate 504 overlaps the N+ diffusion or implant and the N− region 508 to assure a conduction link between the N− region 508 and the N+ region 513. The degree of overlap of the gate 504 into the N− region 508 depends on the amount of conduction needed to trigger the PNPN diode since the electron carrier density under the gate 504 is greatly enhanced over the electron concentration due to the N− 508 doping. Also, width of the thin oxide regions under the poly or gates and the frequency of gate placements in the vertical direction determines the ease with which the PNPN diode triggers. The objective is to get the PNPN diode to initiate conduction at a reasonable voltage such as an anode 503 to cathode 511 voltage of 3.3V. Thus, a plurality of gate regions such as 516A and 516B can be placed in sufficient numbers and with sufficient width to enable the SCR to be triggered to the "on" state at a reasonably low voltage. In fact, if the polysilicon thickness of the MOSFET gate 504 is thin enough, say less than 1 µm, there will be essentially no attenuation of the IR light emitted in the silicon layers 507 and 508. Thus, the MOSFET gate shown in FIG. 5A can also be extended as a single rectangle over a substantial portion of P− region and extend well into the N− region along with the thin oxide mask layer.

As can be appreciated by one normally skilled in the art, the gate 504 could have been mirrored about the P− and N− junction such that the gate overlaps the left end of the P+ region and right end of the P− region and fully covering the N− region. In this case a negative gate bias would be required to invert the N− surface to get the SCR to trigger.

Figure 6:
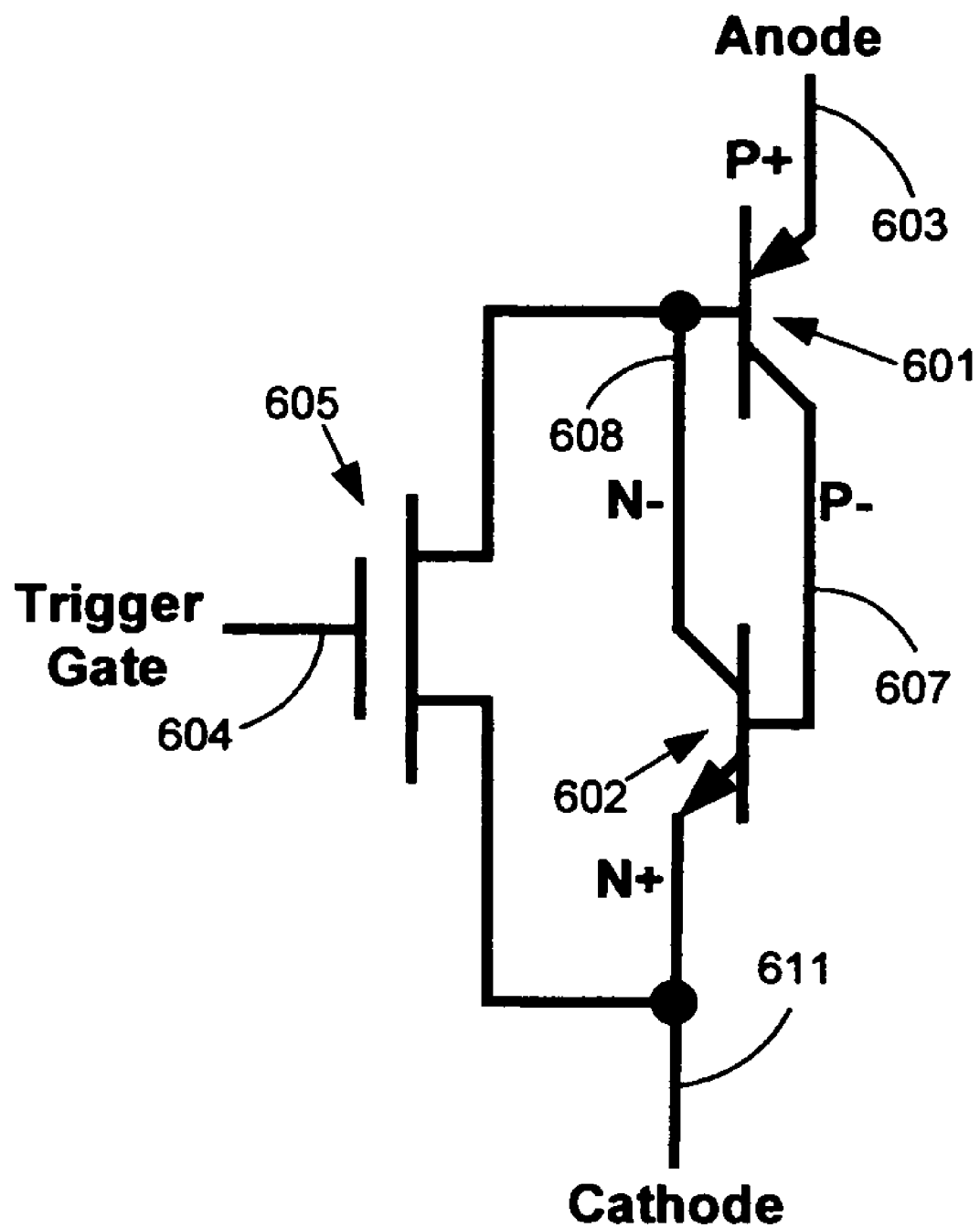
FIG. 6 shows a schematic diagram corresponding to the SCR of FIGS. 5A and 5B

FIG. 6 shows a schematic representation of the gated PNPN structure. The Anode 603 is connected to the P+ diffusion corresponding to 514 of FIG. 5B. The node 608 comprises the N− region 508 with the gate 516A and 516B overlap of the N− region 508 making a drain connection of the N MOSFET 605. The gate 604 of the N MOSFET 605 is poly silicon 504 over the active of thin oxide area 516A and 516B. The node 607 comprises the P− region 507 of FIG. 5B. Node 611 is the cathode and is formed by the N+ region 513 of FIG. 5B. The source connection is made with the overlap of the gate 516A and 516B of the N+ region 513. When a sufficiently high positive voltage with respect to the cathode 611 is applied to the gate 604 of the trigger N MOSFET 605 a current will flow from the Anode 603 to the base of the PNP 601. This will cause the collector current of the PNP 601 to flow into the base 607 of the NPN 602 and turn it "on" thereby causing collector current from the NPN 602 to flow out of the base of the PNP 601 thus enabling the latch-up state with current flowing from the Anode 603 to the Cathode 611 via the two bipolar transistors 601 and 602. Once in the conducting state, the gate voltage 604 can go to 0V with no effect on the latch-up state. The latch-up state of the PNPN structure can be changed to the off state only by lowering the Anode 603 to Cathode 611 current to below the holding current.

Figure 7A:
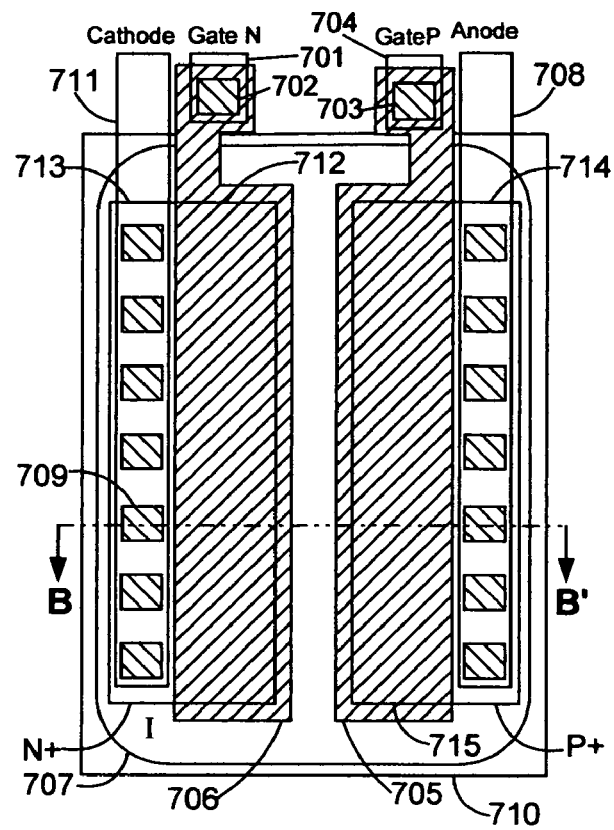
FIG. 7A shows a top view and FIG. 7B shows a side view of a PIN diode functioning as an LED with two MOS gates used to bring opposite polarity charge carriers to the center of the Intrinsic region and FIG. 7C shows a doping variation.
Figure 7B:
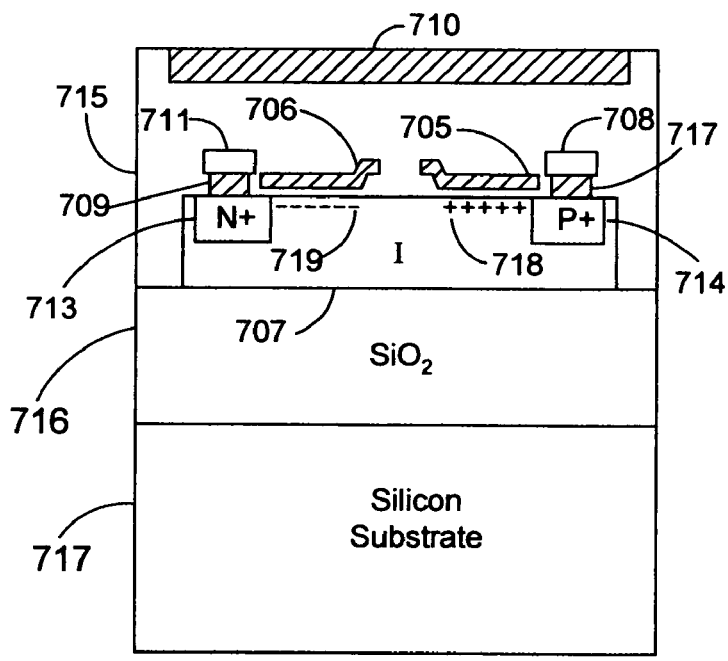

FIG. 7A is a top view of a PIN LED diode with two MOSFET gates and FIG. 7B is a corresponding side view. The center region 707 labeled "I" is an intrinsic or un-doped region of silicon. The intrinsic region 707 has an N+ implant or diffusion 713 at one end and a P+ implant or diffusion 714 at the opposite end. The intrinsic region 707 sets on top of the BOX layer 702, which in turn sets on top of a silicon substrate 701. An example of a contact 709 to the N+ implant of diffusion 713 is shown in FIGS. 7A and 7B with the cathode connecting metal 711 connecting to contact 709. Also, an example of a contact 717 to the P+ implant or diffusion 714 is shown in FIGS. 7A and 7B with the anode connecting metal 703 connecting to contact 717. A metal reflector 710 is placed above the PIN LED.

The intrinsic region 707 offers the best environment for radiation recombination of holes and electrons to generate IR light. To get electrons to the center region and away from the N+ 713 and P+ 714 regions where recombination is less likely to produce light two MOS polysilicon gates are placed above the intrinsic region 707 between the N+ 713 and P+ 714 diffusions or implants. The thin oxide region under the polysilicon gate 706 is defined by the active layer 712 and the thin oxide region under the polysilicon gate 705 is defined by active layer 715. Areas under the polysilicon gates 705 and 706 that are outside active layers 712 and 715 are thick of field oxide regions. The thin oxide region 712 under gate 706 has a silicon interface layer of electrons 719, which is established by applying a positive bias to the gate 706. The gate 706 is connected to the gate metal terminal 701 by contact 702. The thin oxide region 715 under gate 705 has a silicon interface layer of holes 718, which is established by applying a negative bias to the gate 705. The gate 705 is connected to the gate metal terminal 704 by contact 703.

To operate the LED, the N+ diffusion 713 is connected to ground, the gate 706 is connected to a positive voltage such as but not limited to +5V and the gate 705 is connected to a negative voltage such as but not limited to −5V. A positive voltage is applied to the P+ diffusion 714 such that the PIN diode is forward biased. This causes the interface layer of holes 718 under the gate 705 to move into the electron layer 719 and conversely the electrons to move into the hole layer 718. Thus, holes and electrons mix and recombine in the center area of the polysilicon gate gap and away from the N+ 713 and P+ 714 diffusions. The electrons are sourced by the N+ diffusion 713 and move along the interface 719 to the center mixing area and holes are sourced by the P+ diffusion and move along the interface 718 to the center mixing area.

As can be appreciated by one normally skilled in the art, the two gates 706 and 705 can be made so that one overlaps the other to narrow the gap between the gates. However, whereas one polysilicon deposition is required to make the structure shown in FIGS. 7A and 7B two overlapping polysilicon gates require two separate polysilicon depositions.

Figure 7C:
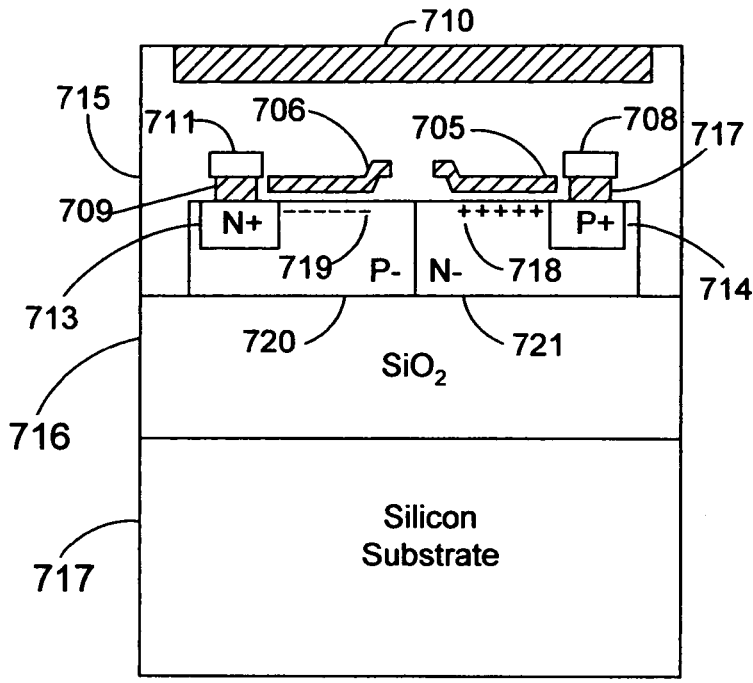

FIG. 7C shows a variant in which a lightly doped P region 720 is under the gate 706 overlapping the N+ region 713 and in which a lightly doped N region 721 is under the gate 705 overlapping the P+ region 714. This doping configuration is consistent with standard CMOS masking but with special masking considerations the doping configuration of FIG. 7B can be made as well in a standard CMOS process. Also, masking can be created with a standard CMOS process in which the P− 720 and the N− 721 are interchanged. The key point is to keep the regions 720 and 721 lightly doped or not doped at all (intrinsic).

The LED structures shown in FIGS. 5 and 7 can be used in place of the LEDs 126 of FIGS. 2 and 3. The LEDs of FIGS. 5 and 7 can also be used as the LED 2 shown in FIG. 1

Figure 8:
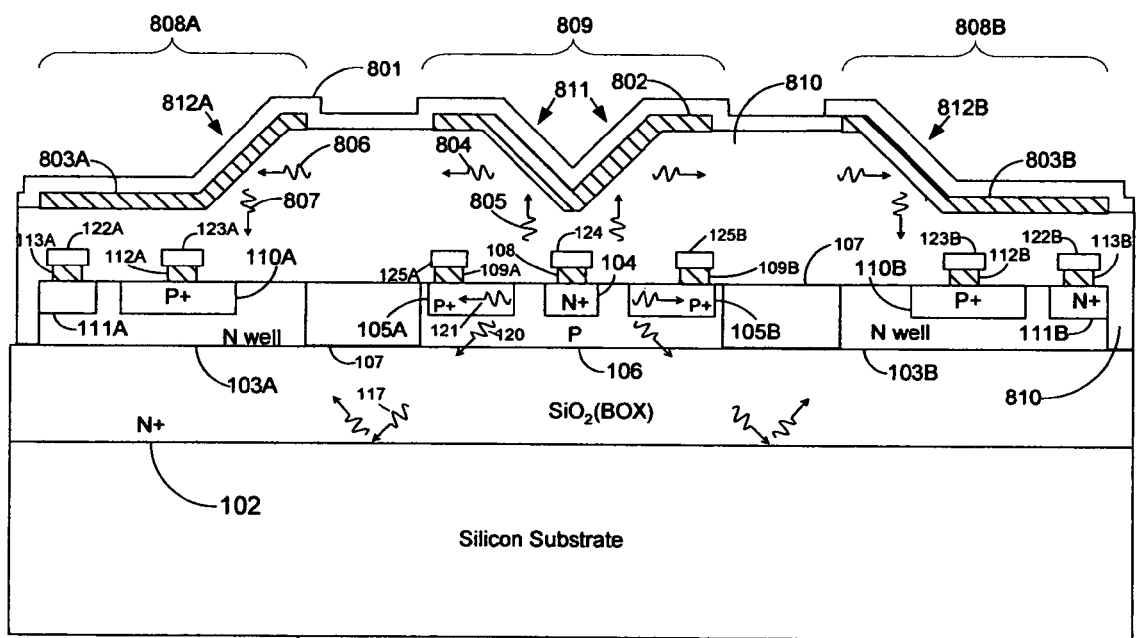
FIG. 8 shows a diagram of and SOI optocoupler which uses sloped reflectors

FIG. 8 shows a cross section of an SOI based ail silicon optocoupler similar to the one shown in FIG. 2B except that the overhead reflector is made more efficient. As in FIG. 2B the cross section shows a PN junction LED 809 and two surrounding PN junction photo detectors 808A and 808B. In this construction a thick layer of SiO$_2$ or other transparent insulator 810 is deposited on the surface of the semiconductor after processing the LED 809 and photo diodes 808A and 808B. Sloped etching 811 of the insulator 810 is then used over the LED 811 making a "V" shaped grove, which can have an angle of from 30 to 60 degrees from the horizontal plane. A sloped etched is also made on one side 812A and 812B over the photo detectors 808A and 808B, respectively. Metal is then deposited and etched forming a "V" shaped reflector 811 over the LED 809. For the photo detectors the metal reflectors 803A and 803B are formed with an angled end. A transparent insulating material 801 with an index of refraction different from that of the insulator 810 is the deposited on the top of the LED-photo diode structure. An example of materials with different indexes of refraction would be SiO$_2$ for 810 and silicon nitride for 801. The depth of the transparent insulator 810 is anywhere from a couple of microns to several microns.

Light that is emitted upward from the LED 809 such as 805 is reflected off of the overhead reflector 802, which redirects the light such as 804 into the general direction of the photo detectors 808A and 808B. Light such as 806 coming into the photo detector area is reflected off of the photo detector reflectors 903A and 903B, which redirects the light such as 807 toward the photo detectors 808A and 808B. Thus, light emitted toward the top of LED 809 is redirected to the photo detectors 808A and 808B using a set of angled reflectors for the LED 809 and for the photo detectors 808A and 808B.

The previous description of the disclosure is provided to enable any person skilled in the art to make use of the disclosure. Various modifications to the disclosure will be readily apparent to those skilled in the art and the generic principles defined herein may be applied to other variations without departing from the scope of the disclosure. Furthermore, although the descriptions of LED construction were shown for SOI, these same elements can be readily applied to bulk silicon technology by any one normally skilled in the art.

What is claimed is:

1. A light emitter, comprising:
   a layer of silicon comprising an N+ region, a P+ region, and a lightly-doped region between the N+ region and the P+ region;
   an anode contact coupled to the P+ region;
   a cathode contact coupled to the N+ region;
   a gate overlapping the lightly-doped region; and
   a gate contact coupled to the gate.

2. The light emitter of claim 1, wherein the lightly doped region has a doping concentration of between $10^{14}$ to $10^{16}$ impurity atoms per cubic centimeter.

3. The light emitter of claim 1, wherein the lightly doped region comprises a P− region adjacent to the N+ region and a N− region adjacent to the P+ region.

4. The light emitter of claim 3, wherein the lightly doped region has a doping concentration of between $10^{14}$ to $10^{16}$ impurity atoms per cubic centimeter.

5. The light emitter of claim 3, wherein the gate overlaps the P− region.

6. The light emitter of claim 5, wherein the gate extends from the N+ region to the N− region.

7. The light emitter of claim 3, wherein the gate overlaps the N− region.

8. The light emitter of claim 3, further comprising a second gate, wherein the first gate overlaps the N− region and the second gate overlaps the P− region.

9. The light emitter of claim 3, further comprising an insulating layer, wherein the layer of silicon is disposed on the insulating layer.

10. The light emitter of claim 3, wherein the insulator layer comprises silicon oxide.

11. The light emitter of claim 10, further comprising a silicon substrate, wherein the insulating layer is disposed on the silicon substrate.

12. An optocoupler, comprising:
    an insulator layer;
    a light emitter comprising:
       a layer of silicon disposed on the insulator layer, the layer of silicon comprising an N+ region, a P+ region, and a lightly doped between the N+ and P+ regions; and
       a gate overlapping the lightly doped or intrinsic region; and a light detector disposed on the insulator layer and electrically isolated from the layer of silicon, wherein the light detector is configured to convert light emissions from the light emitter into an electrical signal.

13. The optocoupler of claim 12, wherein the lightly doped comprises a P− region adjacent to the N+ region and a N− region adjacent to the P+ region.

14. The optocoupler of claim 13, wherein the gate overlaps the N− region.

15. The optocoupler of claim 13, wherein the gate overlaps the P− region.

16. The optocoupler of claim 13, further comprising a second gate, wherein the first gate overlaps the N− region and the second gate overlaps the P− region.

* * * * *